(12) United States Patent
Uno et al.

(10) Patent No.: US 6,210,637 B1
(45) Date of Patent: Apr. 3, 2001

(54) GOLD ALLOY THIN WIRE FOR SEMICONDUCTOR DEVICES

(75) Inventors: Tomohiro Uno; Kohei Tatsumi, both of Kawasaki (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/020,705

(22) Filed: Feb. 9, 1998

(51) Int. Cl.$^7$ ................................. C22C 5/02; H01L 21/60
(52) U.S. Cl. ........................ 420/508; 420/509; 428/606
(58) Field of Search ............................. 420/508, 509; 428/606

(56) References Cited

U.S. PATENT DOCUMENTS

| | | | | |
|---|---|---|---|---|
| 4,752,442 | * | 6/1988 | Asada et al. ................. | 420/507 |
| 4,938,923 | * | 7/1990 | Kujiraoka et al. ............ | 420/509 |
| 5,298,219 | * | 3/1994 | Toyofuku et al. ............ | 420/507 |
| 5,945,065 | * | 8/1999 | Kikuchi et al. .............. | 420/507 |
| 5,993,735 | * | 11/1999 | Kang ........................ | 420/508 |
| 6,080,492 | * | 6/2000 | Uno et al. .................. | 428/606 |

FOREIGN PATENT DOCUMENTS

| | | |
|---|---|---|
| 61-172343 | 8/1986 | (JP) . |
| 61-296731 | 12/1986 | (JP) . |
| 62-22448 | 5/1987 | (JP) . |
| 2-215140 | 8/1990 | (JP) . |
| 6-112251 | 4/1994 | (JP) . |
| 6-824322 | 10/1994 | (JP) . |
| 409272930 | * 10/1997 | (JP) . |
| 409272931 | * 10/1997 | (JP) . |
| 409275119 | * 10/1997 | (JP) . |
| 10083716 | * 3/1998 | (JP) . |

* cited by examiner

*Primary Examiner*—Roy V. King
*Assistant Examiner*—Nicole Coy
(74) *Attorney, Agent, or Firm*—Kenyon & Kenyon

(57) ABSTRACT

The present invention provides a gold alloy thin wire for semiconductor devices, which inhibits corrosion after heating and which improves long term reliability, in portions bonded to the aluminum electrodes.

The gold alloy thin wires of the present invention comprise the following group elements.

(1) The gold alloy thin wire contains, as basic alloying components, 0.005 to 0.3% by weight of Mn and 0.005 to 1.0% by weight of Pd.

(2) A gold alloy thin wire further contains at least one element selected from Pt, Ag and Cu in a total amount of 0.01 to 1.0% by weight in addition to the basic alloying components mentioned above.

(3) A gold alloy thin wire further contains at least one element selected from Ca, Be, In and rare earth elements in a total amount of 0.0005 to 0.05% by weight in addition to the components in (1) or (2).

5 Claims, No Drawings

GOLD ALLOY THIN WIRE FOR SEMICONDUCTOR DEVICES

BACKGROUND OF THE INVENTION

1. Field of the Invention

The present invention relates to a gold alloy thin wire, utilized for connecting electrodes on a semiconductor device to external leads, excellent in the reliability of bonded portions.

2. Description of the Related Art

A gold alloy thin wire is principally used as a bonding wire for bonding electrodes on a semiconductor device to external leads.

Thermosonic wire bonding is generally used as the technology for bonding a gold alloy thin wire. The thermosonic bonding system is a method which includes heating and melting the tip of a gold thin wire with an arc to form a ball due to surface tension, compression bonding the ball portion to an electrode of a semiconductor device heated to a temperature from 150 to 300° C., and connecting the external lead side of the wire to the external lead by ultrasonic compression bonding.

In order to use the semiconductor device as a transistor, an IC, and the like, the Si chip, the bonding wires, and the portion of the lead frame to which Si chip has been attached are sealed with a thermosetting epoxy resin to protect these parts.

The properties a gold thin wire should have are diversified due to the tendency of semiconductors toward becoming highly integrated and thin. For example, the gold alloy thin wire is required to be made long and thin or to be capable of forming a high loop so that the wire can cope with high density and narrow pitch wiring. Moreover, the wire is required to be capable of forming a low loop so that the semiconductor devices can be made thin. In order to cope with the problems of making the wire long and thin and adjusting the loop height, gold thin wires to which several alloying elements are added have been developed and are disclosed, for example, in Kokai.(Japanese Unexmined Patent Publications) No. 61-296731 and No. 61-172343.

The environmental conditions under which semiconductors are used have become very severe recently. For example, semiconductor devices employed within the engine compartments of automobiles are sometimes used in a high temperature or high humidity environment. Moreover, since semiconductor devices are mounted at high densities, the heat generated thereby during use must not be neglected. Furthermore, when a gold alloy thin wire is used, a decrease in the long term reliability of bonded portions with aluminum electrodes, etc. in a high temperature environment has become a problem.

For semiconductor devices used under environmental conditions requiring the devices to have heat resistance, an aluminum alloy thin wire has heretofore been used as a bonding wire, and semiconductor devices packaged in ceramic have been utilized. The aluminum alloy thin wire has the advantage that high reliability in the bonded portions with electrodes on the semiconductor devices can be obtained due to the bonding of metals of the same type. However, ceramics packaging is costly compared with resin sealing, and the aluminum alloy thin wire cannot easily form a normal ball in the air. Accordingly, wedge bonding is commonly practiced, and the productivity of semiconductors is lowered compared with the use of a gold alloy thin wire.

The use of an aluminum alloy thin wire is restricted to specific semiconductors for reasons of cost and productivity. A bonding system with a gold alloy thin wire excellent in high speed bondability, productivity, processability, etc. will continue to be a major process still in the future. In bonding a gold thin wire and the aluminum electrodes together, a gold alloy thin wire having high bonding reliability in a high temperature environment is desired in related industrial fields.

When a conventional gold thin wire is used, a decrease in the long term reliability of bonded portions with aluminum electrodes on semiconductors has been a problem. That is, it has been pointed out, as a problem, that formation of intermetallic compounds and generation of voids resulting from mutual diffusion of the electrode material aluminum and gold cause the peeling of the bonded portions and poor electric conduction therein.

As a result of investigating the reliability of the bonded portions between gold alloy thin wire and aluminum electrodes, the present inventors have confirmed that corrosion of the intermetallic compounds in the resin sealed bonded potions greatly influences the reliability. The reaction of the intermetallic compounds of gold and aluminum, which have grown near the bonded interface, with a halogen component contained in the resin sealing increases the electric resistance of the bonded portions and produces poor electric conduction at the time of significant corrosion.

Since the halogen component is essential as a flame-retardant of the resin sealing, the growth of the corrosive gold/aluminum compound layer must be inhibited for the purpose of decreasing the corrosion of the intermetallic compound layer.

In order to control the diffusion behavior in the bonded portions for the purpose of improving the reliability, addition of alloying elements to the gold thin wire may sometimes be effective. The present inventors also have found elements effective in inhibiting the corrosion, and disclosed the control of the compound phase by adding a Mn element in Kokai (Japanese Unexamined Patent Publication) No. 6-824322. As the amount of addition of Mn increases, oxidation of the thin wire during the formation of a ball in the air causes a problem As a result, the upper limit of the addition amount of the Mn element is restricted. Moreover, it is difficult to completely inhibit a decrease in the bonding strength in the initial stage of corrosion by only adding the Mn element in a small amount. The difficulty of inhibiting corrosion becomes a problem.

SUMMARY OF INVENTION

An object of the present invention is to provide a gold alloy thin wire which improves the bonding reliability by diminishing a decrease in the bonding strength and an increase in the electric resistance involved in the corrosion of compounds, in a state where the ball bonded portions between the gold alloy thin wire and the aluminum electrodes on the semiconductor device are sealed with an epoxy resin.

As a result of doing research to develop a gold alloy thin wire which improves the bonding reliability at high temperature from the standpoint described above, the present inventors have discovered that the addition of Mn and Pd is effective in significantly decreasing the corrosion of the intermetallic compound layer in the resin-sealed bonded portions. Adding mn or Pd singly cannot produce a sufficient effect of inhibiting the corrosion, and composite effects produced by the combination of both elements are required.

The present inventors have further confirmed that addition of Pt, Ag and Cu increases the bonding strength directly after bonding, and have discovered that since addition of Ca, Be, In and rare earth elements decreases the anisotropy of a compression bonded ball diameter, the addition is effective in narrow pitch connection with a small ball.

The present invention is based on the discoveries as mentioned above. In order to achieve the object as mentioned above, the present invention provides a gold alloy thin wire for semiconductors excellent in corrosion resistance, which comprises 0.005 to 0.3% by weight of Mn and 0.005 to 1.0% by weight of Pd as basic alloying components, and the balance gold and unavoidable impurities.

According to a preferred equipment, the gold alloy thin wire of the present invention comprises at least one element selected from Pt, Ag and Cu in a total amount of 0.01 to 1.0% by weight in addition to the basic alloying components, the balance being Au and unavoidable impurities.

According to another preferred embodiment, the gold alloy thin wire of the present invention comprises at least one element selected from Ca, Be, In and rare earth elements in a total amount of 0.0005 to 0.95% by weight in addition to the basic alloying components, the balance being Au and unavoidable impurities.

According to still another preferred embodiment, the gold alloy thin wire of the present invention comprises at least one element selected from Pt, Ag and Cu in a total amount of 0.01 to 1.0% by weight, and at least one element selected from Ca, Be, In and rare earth elements in a total amount of 0.0005 to 0.05% by weight in addition to the basic alloying components, the balance being Au and unavoidable impurities.

The present invention further provides a resin-sealed semiconductor device prepared by connecting electrodes on the semiconductor device and external leads with any one of the gold alloy thin wires mentioned above.

DESCRIPTION OF THE PREFERRED EMBODIMENT

High purity gold used in the present invention is a material containing gold having a purity of at least 99.995% by weight and the being balance unavoidable impurities.

When a gold ball-bonded portion is exposed to a high temperature environment, several intermetallic compounds grow as gold and aluminum mutually diffuse at the bonding interface. Among the gold/aluminum compounds, specific compound phases readily react with a halogen element in the sealing resin to cause corrosion. Improper properties caused by the corrosion reaction can be classified into two types, namely an increase in the electric resistance and a decrease in the bonding strength in the bonded portions.

It has been confirmed that addition of Mn and Pd in combination to gold can significantly increase the effects of inhibiting corrosion, and that as a result the bonding reliability can be further improved compared with addition of Mn alone or Pd alone.

The effects of inhibiting the corrosion of the chemical compound phases by the addition of on alone inhibit the progress of corrosion in the interior of the chemical compound phases, and can suppress an increase in the electric resistance at the time of heating for a long period of time. However, the addition of Mn alone exerts no effects on inhibiting a decrease in the bonding strength at the time of heating for a short period of time because voids are formed near the interface between the compound phases and gold in the initial stage of corrosion. Addition of Mn and Pd in combination as the countermeasure can inhibit a decrease in the bonding strength while the formation of the voids is being inhibited.

On the other hand, concerning the addition of Pt group elements including Pd for the purpose of improving the strength of the wire, Kokoku (Japanese Examined Patent Publication) No. 62-22448 discloses a Pd content of less than 0.1%, and Kokai (Japanese Unexamined Patent Publication) No. 6-112251 discloses a Pd content of 0.1 to 5% by weight.

Although the present inventors have confirmed that addition of Pd alone inhibits the growth rate of the compound phases, the effects of corrosion inhibition are not necessarily satisfactory, and addition of Pd in an amount exceeding 1% by weight becomes necessary to obtain the effects of corrosion retardation particularly during heating for a long period of time by which the compounds are broadly corroded.

However, when the Pd content is high, the ball portion has a compressed shape, or the silicon substrate is damaged during bonding due to the hardening of the ball portion. These phenomena are problems. When the addition amount of Pd is made small, there arises no problem about the ball shape. However, there arises a problem in that the effects of inhibiting corrosion are lessened after the growth of the compounds in the bonded portion are heated for a long time.

Addition of Mn in combination inhibits an increase in the electric resistance though addition of Pd alone hardly inhibits it, and the effects of inhibiting the progress of corrosion can be greatly increased by the addition of Pd even in a small amount. For the reasons described above, the use of Mn and Pd in combination is effective in inhibiting the progress of corrosion for short and long periods of time.

The present inventors have confirmed that a Mn content of 0.005 to 0.3% by weight and a Pd content of 0.005 to 1.0% by weight improve the bonding reliability.

The Mn content is defined for the reasons described below. When the Mn content is less than 0.005% by weight, the effects of inhibiting corrosion of the intermetallic compounds in the bonded portions are insignificant. On the other hand, when the mn content exceeds 0.3% by weight, the sphericity of the ball portion formed on the wire tip is lowered, and a ball portion having a compressed shape is formed. As a result, preparation of a ball having a small diameter, which is preferred because of its capability of coping with a short pitched electrode-to-electrode distance on the semiconductor device, becomes difficult. When the Mn content is in the range as mentioned above, the effects of improving the reliability can be sufficiently obtained.

Furthermore, when the Pd content is less than 0.005% by weight, the effects of using Pd in combination with Mn as described above are very small. When the Pd content exceeds 1.0% by weight, the ball portion is hardened to damage the silicon substrate, or an oxidized film is formed on the ball surface to lower the bondibility with the aluminum electrodes. Accordingly, the Pd content is defined to be from 0.005 to 1.0% by weight.

The bonding strength immediately after bonding is important as the bondability of the Au ball portion with the aluminum electrodes. As the ball becomes small, ensuring the bonding strength sometimes becomes difficult. In ball bonding (small ball) of a gold wire to which Mn and Pd are added, an improvement of the bonding strength immediately after bonding sometimes becomes a problem when the oxidized film on the aluminum surface is solid, or the like. Further addition of at least one of Pt, Ag and Cu promotes the growth of compounds at the bond interface, and the bonding strength is increased.

The total content of at least one of Pt, Ag and Cu is defined to be from 0.01 to 1.0% by weight for reasons as described below. When the content is less than 0.01% by weight, the effects of increasing the bonding strength is not sufficient. When the content exceeds 1.0% by weight, the sphericity of the ball is lowered, and consequently adverse effects are exerted on the formation and bonding of a small ball.

In narrow pitch connection, when the compression bonded ball has an anisotropy in shape, the shape causes the problem that adjacent balls come into contact, or the like. That is, when the shape of a ball subsequent to compression bonding is observed and an anisotropy of the shape, namely a large deviation of the shape from complete sphericity, causes the problem that adjacent balls come into contact, or the like, in a narrow pitch connection. Moreover, since addition of the first or second group elements increases the hardness of the ball, the load and the ultrasonic vibration must be increased during bonding to ensure the bonding area. In such a case, the anisotropy of the shape of the compression bonded ball may become a problem.

The anisotropy during deformation of the ball can be lowered and the bonding strength can also be increased by allowing the gold alloy thin wire to contain at least one of Ca, Be, In and rare earth elements in a total amount of 0.0005 to 0.05% by weight.

The addition of Ca, Be, In and rare earth elements tends to make the grains of the ball portion fine, and appears to be effective in inhibiting the anisotropy during the deformation.

The reasons for defining the content of the Ca, Be, In and rare earth elements are as described below. When the content is less than 0.0005% by weight, sufficient effects cannot be obtained. Moreover, when the content exceeds 0.05% by weight, a shrinkage cavity is formed at the tip of the ball, and the bondability is lowered.

EXAMPLES

Examples of the present invention will be explained below.

Using electrolytic gold having a purity of at least 99.995% by weight, mother alloys containing the groups of elements mentioned above were prepared separately by melting in a high frequency vacuum melting furnace and casting. Gold alloys each having a chemical composition as shown in Table 1 were prepared from given amounts of the thus obtained mother alloys containing addition elements and electrolytic gold having a purity of at least 99.995% by weight by melting with a high frequency vacuum melting furnace and casting. The ingots thus obtained were rolled, and wire drawn at room temperature. The wires were subjected to intermediate annealing if necessary, and the wire was drawn further to give gold alloy thin wires each having a final wire diameter of 25 $\mu$m. The resultant wires were continuously annealed in the air to show an elongation of about 4%.

A gold alloy ball was formed on any of the gold alloy thin wires by an arc discharge, using an electric torch, in a high speed automatic bonder. The shape of the gold. alloy ball was observed with a scanning electron microscope, and evaluated in accordance with the following criteria:

x: the wire cannot be bonded well to an electrode on a semiconductor device due to the compressed shape having a poor sphericity, formation of a shrinkage cavity at the tip of the ball, or the like, and o: the wire can be bonded well thereto.

The anisotropy of the ball deformation was evaluated by bonding gold ball portions to aluminum electrodes by thermocompression bonding, measuring the compression bonded diameter of each of the 50 ball portions in two directions, namely in a direction normal to that of applying ultrasonic waves (Dx) and in a direction parallel thereto (Dy), and obtaining the ratio of Dx to Dy.

The anisotropy was evaluated in accordance with the following criteria:

⊕: the average value of the Dy/Dx ratios is from 0.98 to 1.02 (When the Dy/Dx ratio is closer to 1.0, the ball has deformed while maintaining a more complete sphere. When the average value is in the range mentioned above, the balls substantially have no anisotropy.);

o: the average value of the Dy/Dx ratio is from 0.95 to 0.98, or 1.02 to 1.05 (The anisotropy is to such a degree that no problem arises.); and Δ: the average value of the Dy/Dx ratio is less than 0.95, or exceeds 1.05 (Care must be taken in narrow pitch connections.)

The bonding strength of the gold ball portions was measured by a shear test method as described below. After high speed automatic wire bonding, the lead frame and the semiconductor device to be measured were fixed in a jig. The jig was subjected to parallel movement 3 $\mu$m above the aluminum electrode, and the shear breakage was read. The average value of the breaking load of 50 wires was obtained.

A ball formed on the tip of a gold alloy thin wire was bonded to the aluminum electrode of a semiconductor device, and sealed with an epoxy resin. The semiconductor device was heat treated in a nitrogen gas at 200° C. for 250 hours. The ball bonded portion was polished to the cross section passing through the center of the portion, and the corrosion of the gold-aluminum intermetallic compound layer grown at the bond interface was observed. The intermetallic compound layer had a gray color, and became brown when corrosion proceeded in the layer. The progress of the corrosion of the intermetallic compounds in the ball bonded portion was examined by utilizing the easily distinguishable color difference.

The progress of corrosion of the intermetallic compounds was evaluated from the ratio of the length of the corroded region (b) to the length of the intermetallic compound layer growth (a). The evaluation was made in accordance with the following criteria:

o: the average value of the ratio a/b of 30 ball bonded portions is up to 5%, inhibition of the corrosion being judged to be significant;

x: the average value is at least 40%, corrosion being significant; and

Δ: the average value is 4 to 40%, a value being between the two values mentioned above.

A decrease in the bonding strength subsequent to heating was evaluated as described below. A resin-sealed semiconductor device was heated at 200° C. for 200 hours, and the resin was opened. The shear strength of 200 ball bonded portions was measured by shear test. The results were evaluated in accordance with the following criteria:

x: the bonding strength is lowered to up to a half of a bond prior to heating;

o: the bonding strength is at least 80% thereof; and

Δ: the bonding strength is from 50 to 80% thereof.

Table 1 shows the evaluation results of gold alloy thin wires produced while the wires were made to have chemical compositions of the present invention. Table 2 shows, as comparative examples, the evaluation results of gold alloy thin wires containing the basic components of the present invention in addition amounts outside the range of the present invention. The marks ⊕, o, Δ and x in Tables 1 and 2 show the evaluation results mentioned above.

In Table 1, Examples 9 to 14 are related to claim 2 of the present invention, and Examples 15 to 28 are related to claim 3. Moreover, Examples 29 to 32 show the evaluation results of gold alloy thin wires related to claim 4.

In examples in which Mn and Pd were added in suitable amounts, corrosion of the compound layers in the bonded portions was inhibited, and a decrease in the strength was not observed. On the other hand, although Pd was added in the range of the present invention in Comparative Examples 2 and 3 in Table 2, the Mn content was less than 0.005% by weight. Consequently, the effects of inhibiting corrosion was insignificant, and the bonding strength was lowered slightly. Although Mn was added in the range of the present invention in Comparative Examples 1 and 4, the Pd content was less than 0.005% by weight. As a result, the corrosion proceeded, and the bonding strength subsequent to heating was lowered to up to a half.

It is seen from the results mentioned above that addition of Mn and Pd in combination according to the present invention is effective in obtaining satisfactory effects on the inhibition of corrosion.

It is confirmed in Examples 9 to 14 that since the shear strength measured directly after bonding was at least 65 gf, addition of Pt, Ag and Cu in suitable amounts increased the strength by at least 15 gf.

The anisotropy of the compression bonded diameter of the ball portions was up to 5% with the material components under the bonding conditions of the experiments, and the level does not matter in ordinary packaging. In Examples 15 to 28 in which Ca, Be, In and rare earth elements were added in suitable amounts, the anisotropy was improved to be as low as up to 2%, and, therefore, the addition is appropriate to narrow pitch connections.

It can be seen from the results of observing the ball shapes that the contents of the addition elements exceeding the range of the present invention resulted in the formation of balls which had shapes deviating from complete sphericity, which formed shrinkage cavities at the tips, and the like.

Although the experiments were conducted using pure aluminum as a wiring material on the devices, it has been confirmed that the gold alloy thin wires of the present invention maintains a high corrosion resistance even when aluminum alloys which contain Si, Cu, etc., and which are often used in recent semiconductor devices, are used.

When the gold alloy thin wire according to the present invention is used in bonding electrodes on semiconductor devices and the bonded portions are resin sealed, corrosion of the intermetallic compounds in the bonded portions is inhibited even under high temperature conditions. Accordingly, a gold alloy thin wire having high reliability in the bonded portions, showing good bondability with small balls and capable of coping with high density packaging can be produced.

TABLE 1

[Examples]

| No. | Mn | Pd | Pt | Ag | Cu | Ca | Be | In | Ce | La | Y | Au |
|---|---|---|---|---|---|---|---|---|---|---|---|---|
| 1 | 0.007 | 0.008 | | | | | | | | | | bal* |
| 2 | 0.04 | 0.01 | | | | | | | | | | bal |
| 3 | 0.10 | 0.01 | | | | | | | | | | bal |
| 4 | 0.25 | 0.02 | | | | | | | | | | bal |
| 5 | 0.02 | 0.05 | | | | | | | | | | bal |
| 6 | 0.02 | 0.50 | | | | | | | | | | bal |
| 7 | 0.04 | 0.90 | | | | | | | | | | bal |
| 8 | 0.28 | 0.90 | | | | | | | | | | bal |
| 9 | 0.04 | 0.08 | 0.03 | | | | | | | | | bal |
| 10 | 0.04 | 0.08 | | 0.02 | | | | | | | | bal |
| 11 | 0.04 | 0.08 | | | 0.05 | | | | | | | bal |
| 12 | 0.04 | 0.08 | 0.02 | 0.03 | | | | | | | | bal |
| 13 | 0.04 | 0.08 | 0.5 | | 0.4 | | | | | | | bal |
| 14 | 0.04 | 0.08 | | | 0.9 | | | | | | | bal |
| 15 | 0.04 | 0.08 | | | | 0.0007 | | | | | | bal |
| 16 | 0.04 | 0.08 | | | | 0.003 | | | | | | bal |
| 17 | 0.04 | 0.08 | | | | | 0.0006 | | | | | bal |
| 18 | 0.04 | 0.08 | | | | | 0.03 | | | | | bal |
| 19 | 0.04 | 0.08 | | | | | | 0.007 | | | | bal |
| 20 | 0.04 | 0.08 | | | | | | 0.04 | | | | bal |
| 21 | 0.04 | 0.08 | | | | | | | 0.001 | | | bal |
| 22 | 0.04 | 0.08 | | | | | | | 0.025 | | | bal |
| 23 | 0.04 | 0.08 | | | | | | | | 0.01 | | bal |
| 24 | 0.04 | 0.08 | | | | | | | | 0.03 | | bal |
| 25 | 0.04 | 0.08 | | | | | | | | | 0.007 | bal |
| 26 | 0.04 | 0.08 | | | | | | | | | 0.04 | bal |
| 27 | 0.04 | 0.08 | | | | 0.002 | | 0.006 | 0.002 | | | bal |
| 28 | 0.04 | 0.08 | | | | | 0.002 | | 0.003 | | 0.004 | bal |
| 29 | 0.04 | 0.08 | 0.1 | 0.1 | | 0.003 | | 0.003 | | 0.003 | | bal |
| 30 | 0.04 | 0.08 | | 0.1 | 0.1 | | 0.002 | | 0.003 | | 0.003 | bal |
| 31 | 0.04 | 0.08 | 0.1 | | 0.2 | 0.005 | | | | 0.003 | | bal |
| 32 | 0.04 | 0.08 | | | | | | 0.005 | | 0.004 | 0.003 | bal |

TABLE 1-continued

[Examples]

| No. | Ball shape, damage | Strength directly after bonding (g/f) | Anisotropy of compression bonded ball | Corrosion degree of compounds | Decrease in strength caused by heating |
|---|---|---|---|---|---|
| 1 | ○ | 49.0 | ○ | ○ | ○ |
| 2 | ○ | 48.5 | ○ | ○ | ○ |
| 3 | ○ | 48.6 | ○ | ○ | ○ |
| 4 | ○ | 47.8 | ○ | ○ | ○ |
| 5 | ○ | 48.3 | ○ | ○ | ○ |
| 6 | ○ | 48.9 | ○ | ○ | ○ |
| 7 | ○ | 49.2 | ○ | ○ | ○ |
| 8 | ○ | 48.0 | ○ | ○ | ○ |
| 9 | ○ | 63.1 | ○ | ○ | ○ |
| 10 | ○ | 63.8 | ○ | ○ | ○ |
| 11 | ○ | 64.2 | ○ | ○ | ○ |
| 12 | ○ | 64.8 | ○ | ○ | ○ |
| 13 | ○ | 68.6 | ○ | ○ | ○ |
| 14 | ○ | 68.2 | ○ | ○ | ○ |
| 15 | ○ | 48.7 | ⊕ | ○ | ○ |
| 16 | ○ | 47.7 | ⊕ | ○ | ○ |
| 17 | ○ | 48.0 | ⊕ | ○ | ○ |
| 18 | ○ | 48.1 | ⊕ | ○ | ○ |
| 19 | ○ | 47.2 | ⊕ | ○ | ○ |
| 20 | ○ | 47.6 | ⊕ | ○ | ○ |
| 21 | ○ | 48.2 | ⊕ | ○ | ○ |
| 22 | ○ | 47.2 | ⊕ | ○ | ○ |
| 23 | ○ | 47.5 | ⊕ | ○ | ○ |
| 24 | ○ | 48.0 | ⊕ | ○ | ○ |
| 25 | ○ | 47.7 | ⊕ | ○ | ○ |
| 26 | ○ | 47.9 | ⊕ | ○ | ○ |
| 27 | ○ | 48.8 | ⊕ | ○ | ○ |
| 28 | ○ | 47.6 | ⊕ | ○ | ○ |
| 29 | ○ | 68.3 | ⊕ | ○ | ○ |
| 30 | ○ | 67.9 | ⊕ | ○ | ○ |
| 31 | ○ | 68.5 | ⊕ | ○ | ○ |
| 32 | ○ | 68.8 | ⊕ | ○ | ○ |

Note: bal = balance

TABLE 2

[Comparative Examples]

| | Chemical composition | | | | | | | | | | | |
|---|---|---|---|---|---|---|---|---|---|---|---|---|
| No. | Mn | Pd | Pt | Ag | Cu | Ca | Be | In | Ce | La | Y | Au |
| 1 | 0.080 | | | | | | | | | | | bal* |
| 2 | 0.002 | 0.05 | | | | | | | | | | bal |
| 3 | | 0.10 | | | | | | | | | | bal |
| 4 | 0.040 | 0.003 | | | | | | | | | | bal |
| 5 | 0.350 | 0.05 | | | | | | | | | | bal |
| 6 | 0.040 | 1.20 | | | | | | | | | | bal |
| 7 | 0.450 | 1.50 | | | | | | | | | | bal |
| 8 | 0.04 | 0.08 | 0.008 | | | | | | | | | bal |
| 9 | 0.04 | 0.08 | | 0.008 | | | | | | | | bal |
| 10 | 0.04 | 0.08 | | | 0.008 | | | | | | | bal |
| 11 | 0.04 | 0.08 | 0.005 | | 0.004 | | | | | | | bal |
| 12 | 0.04 | 0.08 | 1.2 | | | | | | | | | bal |
| 13 | 0.04 | 0.08 | | 1.3 | | | | | | | | bal |
| 14 | 0.04 | 0.08 | | | 1.1 | | | | | | | bal |
| 15 | 0.04 | 0.08 | 0.5 | 0.7 | | | | | | | | bal |
| 16 | 0.04 | 0.08 | | | | 0.0002 | | | 0.0402 | | | bal |
| 17 | 0.04 | 0.08 | | | | | 0.0001 | | | 0.0001 | 0.0002 | bal |
| 18 | 0.04 | 0.08 | | | | | | 0.0001 | | | 0.0001 | bal |
| 19 | 0.04 | 0.08 | | | | 0.06 | | | | | | bal |
| 20 | 0.04 | 0.08 | | | | | | | | 0.06 | | bal |
| 21 | 0.04 | 0.08 | | | | | 0.02 | 0.02 | | | 0.02 | bal |
| 22 | 0.04 | 0.08 | | | | 0.03 | | | | 0.02 | 0.02 | bal |

TABLE 2-continued

[Comparative Examples]

| No. | Ball shape, damage | Strength directly after bonding (g/f) | Anisotropy of compression bonded ball | Corrosion degree of compounds | Decrease in strength caused by heating |
|---|---|---|---|---|---|
| 1 | ○ | 47.9 | ○ | Δ | x |
| 2 | ○ | 48.7 | ○ | x | Δ |
| 3 | ○ | 48.2 | ○ | x | Δ |
| 4 | ○ | 47.7 | ○ | Δ | x |
| 5 | x | 47.6 | ○ | ○ | ○ |
| 6 | x | 46.6 | ○ | ○ | ○ |
| 7 | x | 45.9 | ○ | ○ | ○ |
| 8 | ○ | 48.8 | ○ | ○ | ○ |
| 9 | ○ | 49.2 | ○ | ○ | ○ |
| 10 | ○ | 49.5 | ○ | ○ | ○ |
| 11 | ○ | 49.7 | ○ | ○ | ○ |
| 12 | x | 68.7 | ○ | ○ | ○ |
| 13 | x | 67.9 | ○ | ○ | ○ |
| 14 | x | 69.1 | ○ | ○ | ○ |
| 15 | x | 68.5 | ○ | ○ | ○ |
| 16 | ○ | 47.7 | ○ | ○ | ○ |
| 17 | ○ | 48.6 | ○ | ○ | ○ |
| 18 | ○ | 47.7 | ○ | ○ | ○ |
| 19 | x | 47.5 | ○ | ○ | ○ |
| 20 | x | 48.1 | ○ | ○ | ○ |
| 21 | x | 47.4 | ⊕ | ○ | ○ |
| 22 | x | 48.9 | ⊕ | ○ | ○ |

Note: bal = balance

What is claimed is:

1. A corrosion resistant gold alloy thin wire for semiconductor devices which comprises 0.005 to 0.3% by weight of Mn, 0.005 to 1.0% by weight of Pd, the balance being gold and unavoidable impurities.

2. A corrosion resistant gold alloy thin wire for semiconductor devices according to claim 1, which further comprises at least one element selected from Pt, Ag and Cu in a total amount of 0.01 to 1.0% by weight.

3. A corrosion resistant gold alloy thin wire for semiconductor devices according to claim 1, which further comprises at least one element selected from Ca, Be, In and rare earth elements in a total amount of 0.0005 to 0.05% by weight.

4. A corrosion resistant gold alloy thin wire for semiconductor devices according to claim 1, which further comprises at least one element selected from Pt, Ag and Cu in a total amount of 0.01 to 1.0% by weight and at least one element selected from Ca, Be, In and rare earth elements in a total amount of 0.0005 to 0.05% by weight.

5. A resin-sealed semiconductor device prepared by connecting electrodes on the semiconductor device and external leads using a gold alloy thin wire according to any one of claims 1 to 4.

* * * * *